United States Patent
Kang et al.

(10) Patent No.: US 9,579,867 B2
(45) Date of Patent: Feb. 28, 2017

(54) NANOTUBE FILM ELECTRODE AND AN ELECTROACTIVE DEVICE FABRICATED WITH THE NANOTUBE FILM ELECTRODE AND METHODS FOR MAKING SAME

(71) Applicant: The United States of America as represented by the Administrator of the National Aeronautics and Space Administration, Washington, DC (US)

(72) Inventors: Jin Ho Kang, Newport News, VA (US); Cheol Park, Yorktown, VA (US); Joycelyn S. Harrison, Arlington, VA (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 613 days.

(21) Appl. No.: 13/938,622

(22) Filed: Jul. 10, 2013

(65) Prior Publication Data
US 2015/0258748 A1    Sep. 17, 2015

Related U.S. Application Data

(62) Division of application No. 13/284,061, filed on Oct. 28, 2011, now abandoned, which is a division of
(Continued)

(51) Int. Cl.
*B32B 5/16* (2006.01)
*H01L 41/047* (2006.01)
(Continued)

(52) U.S. Cl.
CPC ............. *B32B 5/16* (2013.01); *B32B 37/14* (2013.01); *H01L 41/0478* (2013.01); *H01L 41/29* (2013.01); *H01L 41/45* (2013.01); *B82Y 30/00* (2013.01); *C08K 7/24* (2013.01); *Y10S 977/75* (2013.01); *Y10S 977/751* (2013.01);
(Continued)

(58) Field of Classification Search
CPC ........................................................ B32B 5/16
See application file for complete search history.

(56) References Cited

U.S. PATENT DOCUMENTS

2004/0197546 A1* 10/2004 Rinzler .................. B82Y 10/00
428/311.51

* cited by examiner

*Primary Examiner* — Larry Thrower
(74) *Attorney, Agent, or Firm* — Jennifer L. Riley (57) ABSTRACT

Disclosed is a single wall carbon nanotube (SWCNT) film electrode (FE), all-organic electroactive device systems fabricated with the SWNT-FE, and methods for making same. The SWCNT can be replaced by other types of nanotubes. The SWCNT film can be obtained by filtering SWCNT solution onto the surface of an anodized alumina membrane. A freestanding flexible SWCNT film can be collected by breaking up this brittle membrane. The conductivity of this SWCNT film can advantageously be higher than 280 S/cm. An electroactive polymer (EAP) actuator layered with the SWNT-FE shows a higher electric field-induced strain than an EAP layered with metal electrodes because the flexible SWNT-FE relieves the restraint of the displacement of the polymeric active layer as compared to the metal electrode. In addition, if thin enough, the SWNT-FE is transparent in the visible light range, thus making it suitable for use in actuators used in optical devices.

14 Claims, 5 Drawing Sheets

Related U.S. Application Data application No. 11/937,155, filed on Nov. 8, 2007, now abandoned.

(60) Provisional application No. 60/984,027, filed on Oct. 31, 2007, provisional application No. 60/857,531, filed on Nov. 8, 2006.

(51) Int. Cl.
*H01L 41/29* (2013.01)
*H01L 41/45* (2013.01)
*B32B 37/14* (2006.01)
*C08K 7/24* (2006.01)
*B82Y 30/00* (2011.01)

(52) U.S. Cl.
CPC ........ *Y10S 977/752* (2013.01); *Y10S 977/762* (2013.01); *Y10T 156/10* (2015.01); *Y10T 428/249921* (2015.04)

NANOTUBE FILM ELECTRODE AND AN ELECTROACTIVE DEVICE FABRICATED WITH THE NANOTUBE FILM ELECTRODE AND METHODS FOR MAKING SAME

CROSS REFERENCE TO RELATED APPLICATION

This patent application is a divisional of U.S. patent application Ser. No. 11/937,155, filed Nov. 8, 2007, now abandoned; and U.S. patent application Ser. No. 13/284,061, filed Oct. 28, 2011; this application claims the benefits of U.S. Provisional Application Nos. 60/857,531, filed Nov. 8, 2006, and 60/984,027 filed Oct. 31, 2007; the contents of all of which are incorporated herein in their entirety.

ORIGIN OF THE INVENTION

The invention described herein was made by an employee of the United States Government and may be manufactured and used by or for the Government of the United States of America for governmental purposes without the payment of any royalties thereon or therefor.

FIELD OF THE INVENTION

This invention relates generally to electroactive polymeric devices and compliant electrodes for these devices. More specifically, the invention relates to electroactive polymeric devices utilizing highly compliant nanotube film electrodes and methods for making same.

DESCRIPTION OF THE RELATED ART

As an interest in high performance polymeric electroactive devices increases, a request for new electrode materials has emerged. Known electroactive polymeric devices typically use metal electrodes, such as silver and gold, to provide electric fields. These metal electrodes often inhibit the displacement (elongation or contraction) of their electroactive layer because of less compliance (greater stiffness (modulus)) of the metal electrodes than the active polymer itself. Thus, the actual electric field-induced strain output of these devices with metal electrodes is always smaller than what they could intrinsically provide.

Conducting polymers have been used as alternative electrodes for electroactive polymeric devices. The conducting polymers relieved the restraint of movement in the polymeric active layer because their compliance is similar to that of the active polymeric layer, and exhibited higher strain than metal electrodes did. However, these conducting polymers have a disadvantage of low conductivity at high temperatures because of dehydration phenomena and dedoping, and therefore are unable to be used for applications which require high thermal stability. Therefore, a need existed for an alternative electrode with less stiffness than the conventional metallic electrodes and with good thermal stability.

SUMMARY OF THE INVENTION

In accordance with at least one embodiment of the present invention a novel freestanding flexible single-walled carbon nanotubes (SWCNT) film electrode (SWCNT-FE) is provided. This inventive electrode shows high conductivity and good thermal stability with comparable compliance to polymeric active layers. Additionally, in accordance with at least one embodiment of the present invention, a novel high performance all-organic electroactive device (or system) is provided, fabricated with the SWCNT-FE. Methods for the preparation of the electrode and device are also provided within the scope of the present invention. Features and advantages of the inventions will be apparent from the following detailed description taken in conjunction with the following figures.

BRIEF DESCRIPTION OF THE DRAWINGS

FIG. 2B shows a more detailed image of the pulled and porous networked SWCNTs shown in FIG. 2A;

DETAILED DESCRIPTION OF THE INVENTION

Shown in the drawings and described herein in detail are advantageous embodiments of the present invention. It should be understood that the present invention is susceptible of embodiments in many different forms and thus the present disclosure is to be considered as an exemplification of the principles of the invention and is not intended to limit the broad aspect of the invention to the embodiments described and illustrated herein.

Figure 1A:
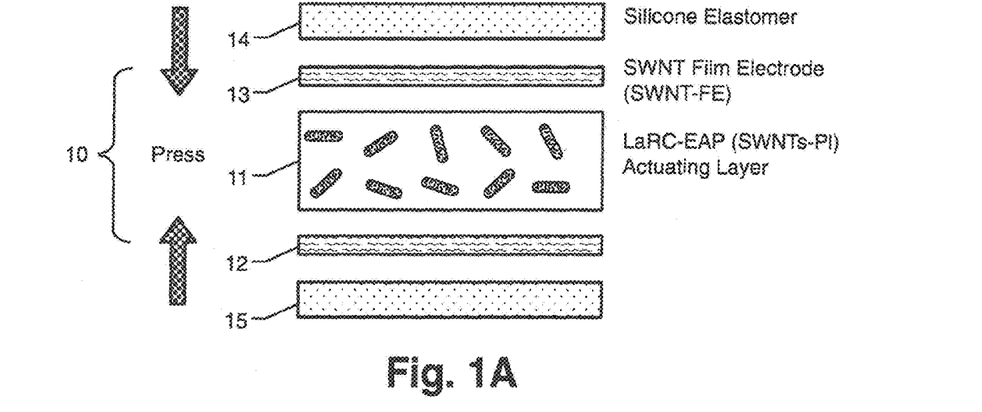
FIG. 1A is a schematic diagram depicting the preparation of an all-organic electroactive device system in accordance with at least one embodiment of the present invention.
Figure 1B:
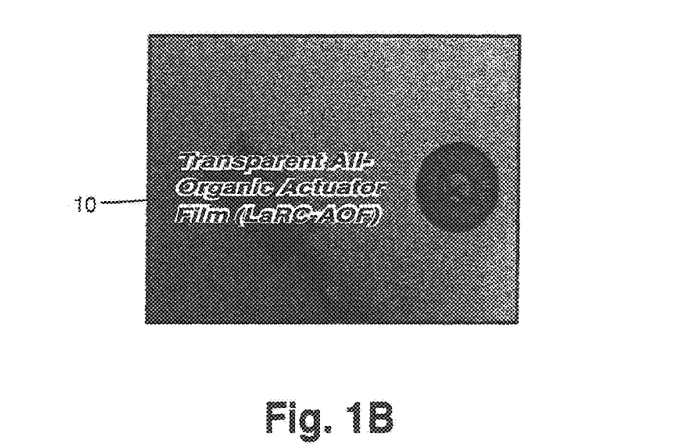
FIG. 1B shows a photograph of a prototype of a transparent electroactive device fabricated with an EAP active layer and SWNT film electrodes, in accordance with at least one embodiment of the present invention.

Referring now to the drawings, FIG. 1A is a diagram depicting the preparation of an all-organic electroactive device system in accordance with at least one embodiment of the present invention (such as the device 10 shown in FIG. 1B). A SWCNT film can be prepared by a method similar to the method set forth in A. G. Rinzler and Z. Chen, U.S. Patent Application Publication 20040197546 (Oct. 7, 2004), the entire contents of which are hereby incorporated by reference. However, in accordance with the present invention, unlike Application Publication 20040197546, no surfactant is required to develop the SWNT film and no solvent is necessary to isolate the SWNT film from the filter membrane (by dissolving the membrane). Additionally, it should be understood that while the described inventive embodiment utilizes SWCNTs, it is nevertheless within the scope of the present invention to replace the SWCNTs with multi-walled carbon nanotubes (MWCNT) or few wall carbon nanotubes (FWCNT). Additionally, other types of conductive nanotubes can be used in the instant invention, for example, boron nanotubes, boron carbon nitride nanotubes, and/or boron nitride nanotubes.

To explain, in accordance with one inventive method, the inventive electrode can be developed as follows. First, SWCNTs can be dispersed in an solvent, such as N,N-Dimethylacetamide (DMAc), under sonication and filtered onto the surface of a brittle or breakable porous membrane, such as an anodized alumina membrane (pore size: 0.2 μm), to form a SWNT film on the membrane. Advantageous dispersion methods (not requiring surfactants or covalent bonds), and choices of appropriate solvents, which can be utilized in accordance with the present invention, can be found in co-pending U.S. Patent Applications, namely, application Ser. No. 10/288,797, entitled "Electrically Conductive, Optically transparent Polymer/Carbon Nanotube Composites and Process for Preparation Thereof," filed Nov. 1, 2002; application Ser. No. 11/432,201, entitled "Dispersions of Carbon Nanotubes in Polymer Matrices," filed on May 11, 2006; and application Ser. No. 11/644,019, entitled "Nanocomposites from Stable Dispersions of Carbon Nanotubes in Polymeric Matrices Using Dispersion Interaction," filed on Dec. 22, 2006. These three pending U.S. patent applications are incorporated herein by reference as set forth in their entirety.

Figure 5A:
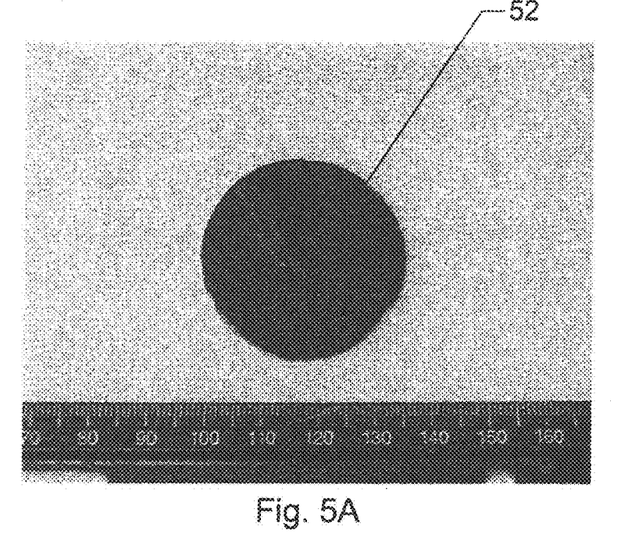
FIGS. 5A and 5B are photographs of a freestanding flexible SWCNT-FE in accordance with at least one embodiment of the present invention, after it is removed from the membrane (shown in 5B), in accordance with the present invention.
Figure 5B:
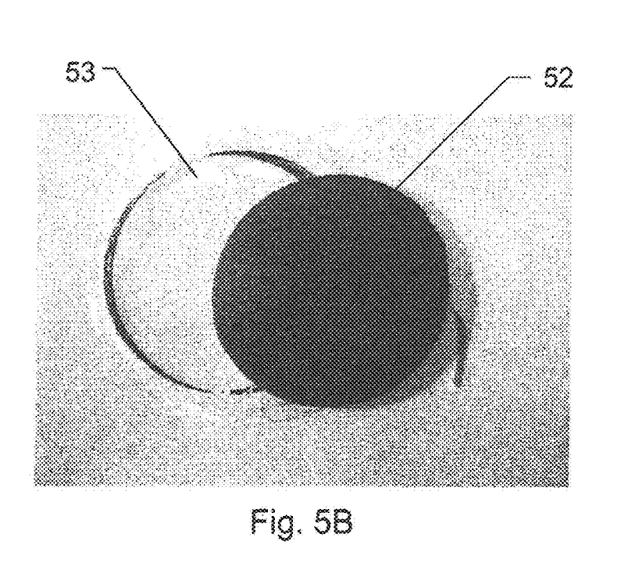

After the formation of the SWCNT film on the membrane (for example, through the removal of the solvent in a known manner), a freestanding SWCNT film can then be easily delaminated by breaking the brittle (e.g. alumina) membrane. This breaking can be accomplished in a manner that would be known to one skilled in the art, the result of which is shown in FIG. 5B. In one advantageous embodiment, the delaminated SWCNT film will have the conductivity of about 280 S/cm. The thickness of the SWCNT film can be controlled from several tens of nanometers to several hundreds of micrometers by adjusting the concentration and quantity of SWCNT solution used. Adjusting the concentration and quantity of SWCNT solution used will also affect the final conductivity of the SWCNT film. Additionally, adjusting the thickness of the film will affect the transparency of the film. For example, it was found that a 2 μm thick SWCNT film was opaque (black), while a 300 nm thick SWCNT film was found to be optically transparent.

Figure 2A:
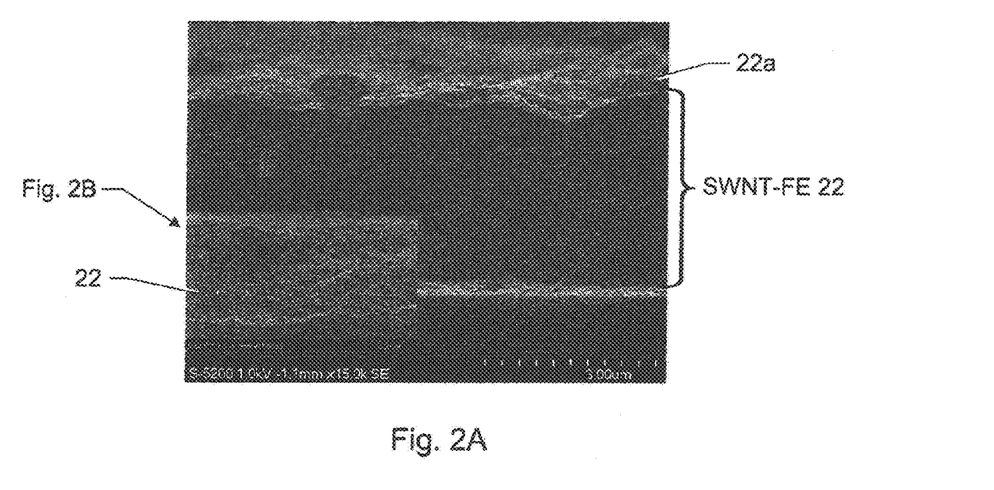
FIG. 2A shows a cross-sectional SEM image of SWCNT-FE after pressing at 600 psi, in accordance with at least one embodiment of the present invention.
Figure 2C:
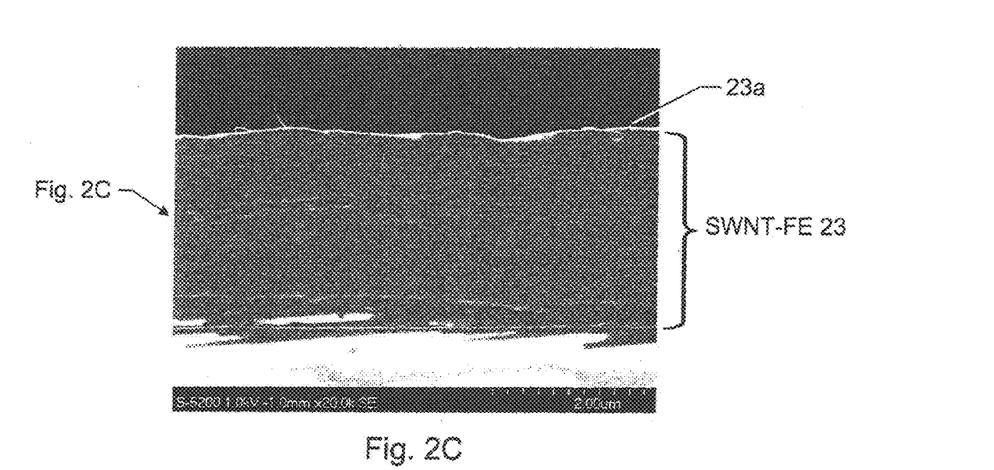
FIG. 2C shows a cross sectional SEM image of SWCNT-FE after pressing at 6000 psi, in accordance with at least one embodiment of the present invention.

In accordance with at least one advantageous embodiment of the present invention, as shown in FIG. 1A, an inventive all-organic electroactive device (SWCNT-FE/EAP/SWCNT-FE) can be fabricated with an electroactive polymer (EAP) active layer 11 and the SWNT films 12, 13 by pressing, for example, at 600, 3000 or 6000 psi, as shown in FIG. 1A. In accordance with one embodiment of the invention, the pressing temperature and time were 230° C. and 2 min., respectively. All of the sample specimens were preheated at 230° C. for 20 minutes prior to pressing. Silicone elastomer plates 14, 15 (e.g., 3 mm thick) can be used on the press plate surfaces for better contact adhesion between the SWCNT film and the actuating layer. This polymeric electroactive device layered with the SWCNT-FE can serve as an actuator. However, it should be understood that it is within the scope of the present invention that other devices (such as sensors, transducers, etc.) could also be fabricated utilizing the novel methods and inventions set forth herein. Additionally, the embodiment shown in FIG. 1A is merely illustrative of one possible device design. As is known in the art, depending upon the desired application and geometry, the device could be configured in many different ways, for example, with different numbers, sizes, shapes and locations of active layers and electrodes (e.g., round, interdigitated, etc.). Also, different types of active layers could be utilized, depending upon the application for which the particular device is designed. Examples of various active layers can be found in U.S. Pat. Nos. 5,891,581 and 5,909,905, as well as pending U.S. patent application Ser. No. 11/076,460, entitled "Sensing/Actuating Materials Made from Carbon Nanotube Polymer Composites and Methods for Making Same," filed Mar. 3, 2005, and pending U.S. patent application Ser. No. 11/081,888, entitled "Multilayer Electroactive Polymer Composite Material," filed on Mar. 9, 2005. These patents and applications are hereby incorporated by reference as if set forth in their entirety herein FIGS. 2A and 2C show SEM images of cross-sections of inventive SWCNT-FEs 22, 23 after pressing at 600 psi and at 6000 psi, respectively. FIG. 2B shows a more detailed image of the pulled and porous networked SWCNTs shown in FIG. 2A. The cross-section of the SWCNT-FE 23 pressed under 6000 psi (FIG. 2C) was denser than that pressed under 600 psi (FIG. 2A).

The density (modulus or compliance) of the SWNT-FE can be controlled by adjusting the fabrication pressure. As explained more fully below, it is anticipated that less dense (higher compliance) SWCNT-FE can present less constraint to the displacement by more closely matching the modulus of the polymeric active layers. Therefore, in at least one advantageous embodiment of the present invention, the fabrication pressure is adjusted to produce a SWCNT-FE with a compliance (and modulus) substantially matching the compliance of the device's active layer. In this manner a device can be fabricated with substantially uniform compliance throughout, thereby potentially improving the performance of the device, for example, by maximizing the electric field-induced strain output of the device.

Figure 3A:
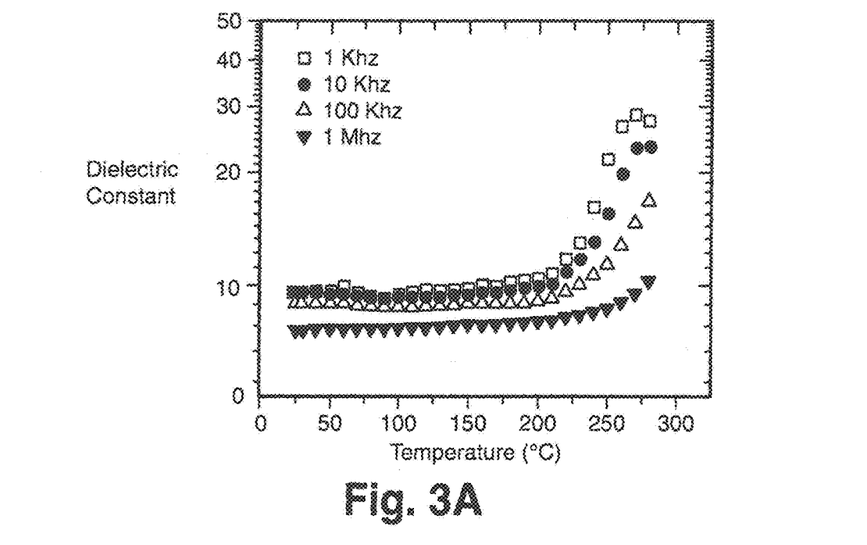
FIG. 3A is a graph depicting the dielectric constant of an inventive EAP layered with SWCNT-FE as a function of temperature and frequency.
Figure 3B:
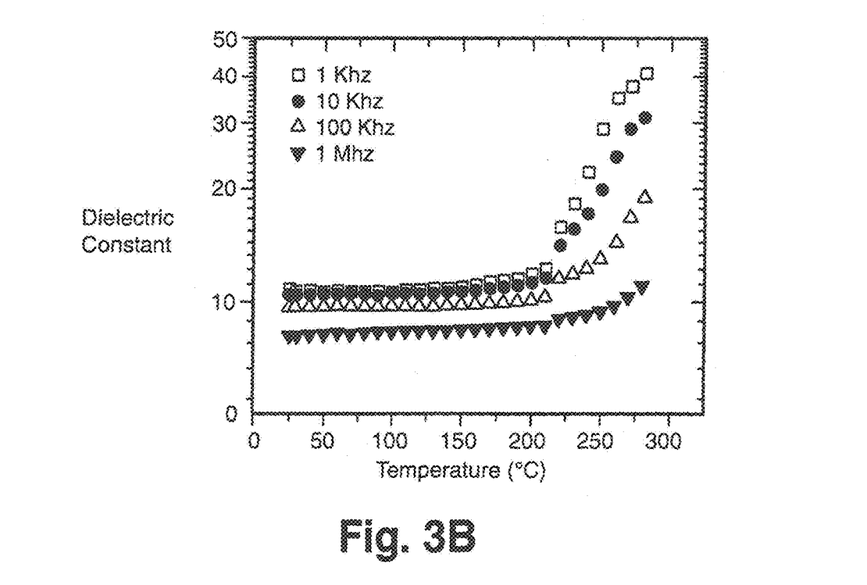
FIG. 3B is a graph depicting the dielectric constant of an EAP layered with metal electrodes as a function of temperature and frequency.

Most conducting polymers become unstable above 120° C., and lose their conductivity significantly. However, for many applications, the actuator system must be able to function at temperatures even up to 200° C. or higher. Therefore, it was necessary to examine if SWCNT-FE functions at a broad range of temperatures and frequencies. The performance of the SWCNT film as an electrode was evaluated by measuring the dielectric properties of an Electroactive Polymer (EAP) layered with the SWNT film as an electrode (SWCNT-FE) at a broad range of temperatures (from 25° C. to 280° C.) and frequencies (from 1 KHz to 1 MHz). The temperature and frequency dependence of the dielectric constant for an EAP layered with SWCNT-FE is shown in FIG. 3A, which is almost the same as that of the dielectric properties of the same EAP layered with gold electrodes (FIG. 3B). The dielectric constant remained constant up to 220° C., and then increased. The increase of the dielectric constant at 220° C. is due to the glass transition temperature ($T_g$) of the EAP (β-CN)APB/ODPA polyimide, U.S. Pat. No. 5,891,581 Joycelyn O. Simpson and Terry St. Clair, "Thermally stable, piezoelectric and pyroelectric polymeric substrates"). Above $T_g$, dipoles have a higher mobility and show a higher dielectric constant. Additionally, as frequency decreases, it is believed that these dipoles have enough time to orient themselves under an applied electric field, creating a higher dielectric constant. Thermally stable dielectric properties suggest that SWCNT-FE is suitable for high temperature applications at least up to 220° C. SWCNT usually do not oxidize below a temperature of about 400° C., therefore, if a higher stability polymer was used a fabricated device could potentially function at a much higher temperature. Success in the use of known conducting polymer electrodes at high temperatures (above 100° C.) has rarely been reported. Conducting polymers have a disadvantage of low conductivity at high temperatures because of dehydration phenomena and dedoping, and therefore are unable to be used for applications which require high thermal stability.

Figure 4:
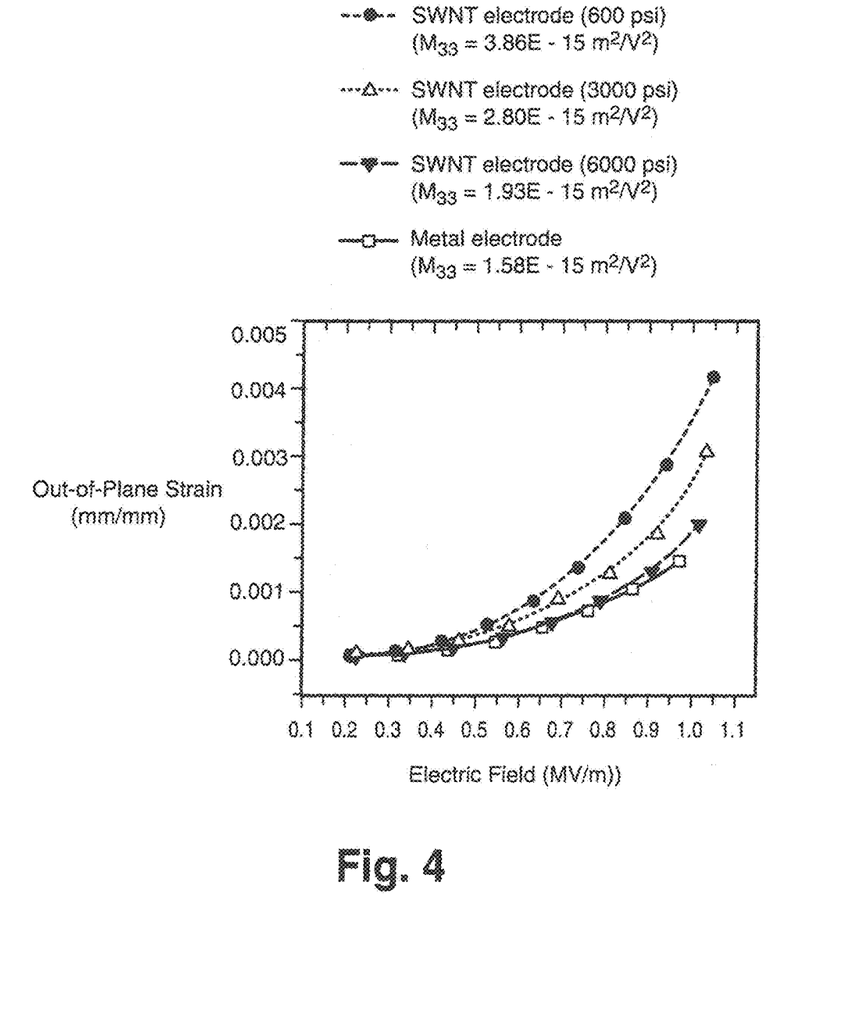
FIG. 4 is a graph depicting the electric field-induced strain of an EAP layered with metal electrodes, and with an inventive SWCNT-FE.

Electric field-induced strain values for EAP layered with metal electrodes and SWCNT-FE are shown in FIG. 4. The EAP actuator layered with the SWCNT-FE showed a higher electric field-induced strain than an EAP layered with metal electrodes under identical measurement conditions since the flexible, highly compliant SWCNT-FE relieves the restraint of the displacement of the polymeric active layer compared to the metal electrode. In addition, as explained above, when prepared thin enough, the SWCNT-FE can be transparent in the visible light range (see FIG. 1B). Actuators fabricated with the transparent SWCNT-FE can be used in optical devices such as optical switches and modulators.

As shown in FIG. 4, the out-of-plane strain ($S_{33}$) through the film thickness was plotted as a function of applied electric field strength. The strain ($S_{33}$) of EAP layered with silver electrodes increased quadratically with increasing applied electric field, indicating that the strain is mainly electrostrictively originated. The electrostrictive coefficient ($M_{33}$) vs. EAP layered with silver electrodes, calculated from a slope in a plot of strain ($S_{33}$) vs. the square of electric field strength (E), $S_{33}=M_{33}E^2$, was 1.58E-15 $m^2/V^2$. The strain of EAP layered with SWCNT-FE after pressing at 600 psi increased more rapidly than that layered with silver electrodes. The electrostrictive coefficient ($M_{33}$) of this SWCNT-FE system (600 psi) was 3.86E-15 $m^2/V^2$, more than 2 times higher than those of EAP layered with silver electrodes. This significant increase in strain indicates that less dense SWCNT-FE seemed to restrain the displacement of the active layer less. Additionally, as the pressure of the fabrication of the EAP/SWCNT-FE system increased, the strain decreased, since the SWNT-FE became denser and could constrain the displacement of the active layer more (FIG. 2A-2C). At 6000 psi, the strain value was close to that of EAP with the silver electrodes, which indicates that the modulus of the SWCNT-FE prepared at 6000 psi was close to that of silver electrodes at the interface, Additionally, all-organic electroactive device systems fabricated with single wall carbon nanotube (SWCNT) films used as electrodes have shown enhanced electroactive performance in comparison with conventional electroactive device system fabricated with metal electrodes. SWCNT can be replaced by multi wall carbon nanotubes (MWCNT) or few wall carbon nanotubes (FWCNT). Further, SWCNT film electrodes (SWCNT-FE) have shown reliable capability as an electrode in an electrical device at high temperatures suitable for aerospace applications. Additionally, other types of conductive nanotubes may also be used in these applications, such as boron nanotubes, boron carbon nitride nanotubes, and/or boron-nitride nanotubes.

As explained above, certain mechanical properties of SWCNT-FE (e.g. Young's modulus) can be controlled by adjusting the magnitude of the fabrication pressure, to form resultant electrodes with mechanical properties substantially matching with those of employed active layers. Additionally, in accordance with at least one embodiment of the invention, higher mechanical properties (e.g. Young's modulus, strength, elongation at break, durability, robustness, etc.) of SWCNT-FE can be achieved by using acid-treated SWNTs (which are commercially available) and post-sintering at above 350° C. temperature. A freestanding flexible SWCNT-FE with high conductivity has been developed. One such inventive freestanding flexible SWCNT-FE 52 is shown in FIGS. 5A and 5B, after delamination by breaking the brittle membrane 53. FIG. 5B shows the freestanding flexible SWCNT-FE 52 sitting on the broken membrane 53. As explained above, a freestanding SWCNT-FE can be pressed during the fabrication of a device, or, in the alternative, it could be independently pressed in order to achieve a desired thickness, conductivity, compliance, transparency, etc As explained above, the thickness of the SWCNT film is easily controlled by the concentration and quantity of SWCNT solution, and it can range from about several tens of nanometers to about several hundreds of micrometers. The SWCNT film which was thinner than several hundreds of nanometer was found to be transparent. Therefore, the freestanding flexible transparent SWCNT film electrodes (SWCNT-FE) enables the inventive all-organic electroactive devices to be used in optical devices such as optical switches and modulators.

Potential applications for an all-organic electroactive device fabricated with carbon nanotubes, e.g., single wall carbon nanotube (SWCNT) film electrodes (SWCNT-FE), include electromechanical energy conversion devices such as electromechanical sensors and actuators, transducers, sonars, medical devices, prosthetics, artificial muscles, and materials for vibration and noise control. The high performance inventive all-organic electroactive devices possess many advantages over piezoceramic and shape-memory alloys owing to their light weight, conformability, high toughness, and tailorable properties needed in these applications. In addition, the transparency of the novel all-organic electroactive devices fabricated with SWNT-FE enables them to be used in optical devices such as optical switches and modulators. The freestanding flexible SWCNT-FE can provide a great degree of freedom to fabricate a variety of complex electroactive devices.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. Additionally, it should be understood that the use of the term "invention" herein should not be limited to the singular, but rather, where applicable, it is meant to include the plural "inventions" as well. Further, in the claims, means-plus-function and step-plus-function clauses are intended to cover the structures or acts described herein as performing the recited function and not only structural equivalents, but also equivalent structures.

What is claimed as new and desired to be secured by Letters Patent of the United States is:

1. An electroactive device fabricated with a nanotube film electrode, comprising:
   at least one nanotube film electrode; and
   at least one active layer;
   wherein each of said at least one nanotube film electrode has a compliance substantially matching the compliance of said at least one active layer; and
   wherein the compliance of said at least one nanotube electrode is controlled at least in part by its density.

2. The electroactive device of claim 1, wherein said active layer comprises an electroactive polymer.

3. The electroactive device of claim 1, wherein the at least one nanotube film electrode has a modulus substantially matching the modulus of the at least one active layer.

4. The electroactive device of claim 1, wherein said device is capable of functioning in high temperature applications of at least up to about 220° C.

5. The electroactive device of claim 1, wherein at least two nanotube film electrodes are present for each active layer, and each active layer has one film electrode on a top surface and one film electrode on a bottom surface.

6. The electroactive device of claim 1, wherein said nanotube film electrode consists essentially of at least one or more of:
   single-walled carbon nanotubes;
   multi-walled carbon nanotubes;
   few walled carbon nanotubes;
   boron nanotubes;
   boron carbon nitride nanotubes, and boron nitride nanotubes.

7. The electroactive device of claim 1, wherein the at least one nanotube film electrode and the at least one active layer are organic.

8. The electroactive device of claim 1, wherein the dielectric constant of the electroactive device remains constant up to 220° C.

9. The electroactive device of claim 1, wherein each of said at least one nanotube film electrode are acid-treated and post sintered.

10. The electroactive device of claim 2, wherein the electroactive polymer comprises a polyimide.

11. The electroactive device of claim 1, wherein the at least one nanotube film electrode is transparent.

12. The electroactive device of claim 1, wherein the at least one nanotube film electrode has a thickness from forty nanometers to two hundred micrometers.

13. The electroactive device of claim 1, wherein the electrostrictive coefficient of the film electrode and active layer system is more than two times higher than the electrostrictive coefficient of a system using the same active layer layered with silver electrodes.

14. The electroactive device of claim 1, wherein the at least one nanotube film electrode has a conductivity higher than 280 S/cm.

* * * * *